United States Patent [19]
Ito

[11] Patent Number: 5,946,477
[45] Date of Patent: Aug. 31, 1999

[54] POSITIONING/WIRING METHOD FOR FLIP-CHIP SEMICONDUCTOR DEVICE

[75] Inventor: Soichi Ito, Tokyo, Japan

[73] Assignee: NEC Corporation, Tokyo, Japan

[21] Appl. No.: 08/705,856

[22] Filed: Aug. 28, 1996

[30] Foreign Application Priority Data

Aug. 30, 1995 [JP] Japan .................................. 7-222290

[51] Int. Cl.⁶ .................................................. G06F 15/60
[52] U.S. Cl. ................................ 395/500.1; 395/500.04; 395/500.09
[58] Field of Search ................................... 364/489, 491, 364/488, 490

[56] References Cited

U.S. PATENT DOCUMENTS

| | | | |
|---|---|---|---|
| 4,835,705 | 5/1989 | Fujino et al. | 364/491 |
| 5,208,764 | 5/1993 | Rusu et al. | 364/491 |
| 5,293,386 | 3/1994 | Mubmenthaler et al. | 371/21.1 |
| 5,659,514 | 8/1997 | Hazani | 365/218 |

FOREIGN PATENT DOCUMENTS

| | | |
|---|---|---|
| 2-244755 | 9/1990 | Japan . |
| 3-97238 | 4/1991 | Japan . |
| 4-196464 | 7/1992 | Japan . |
| 4-357849 | 12/1992 | Japan . |

Primary Examiner—Kevin J. Teska
Assistant Examiner—Thuan Do
Attorney, Agent, or Firm—Whitham, Curtis & Whitham

[57] ABSTRACT

In an automatic positioning/wiring method for a flip-chip semiconductor device which is adapted to design a semiconductor chip including test pads used for inputting/outputting signals in a test, chip terminals respectively arranged on or near the test pads to serve as input/output terminals for an external unit, input/output buffers for exchanging signals with the external unit, and internal circuit blocks which perform predetermined circuit operations in response to signals from the input/output buffers, the internal circuit blocks and the input/output buffers are position/wired in arbitrary regions on the semiconductor chip in an automatic positioning/wiring design process on the basis of a result of a layout position determination process for performing definition such that the input/output buffers and the internal circuit blocks are arranged without discrimination layout regions thereof. A floor plan formation process is performed to arrange the input/output buffers into predetermined groups within the arbitrary region in the form of rows each parallel to one of sides of the semiconductor chip.

11 Claims, 14 Drawing Sheets

POSITIONING/WIRING METHOD FOR FLIP-CHIP SEMICONDUCTOR DEVICE

BACKGROUND OF THE INVENTION

1. Field of the Invention

The present invention relates to a positioning/wiring method for a flip-chip semiconductor device and, more particularly, to a positioning/wiring method for a flip-chip semiconductor device in which a layout design method for input and output buffers (to be referred as input/output buffers hereinafter) is improved.

2. Description of the Prior Art

FIG. 1 is a plan view showing the arrangement of an ASIC chip such as a gate array or a cell base IC based on a positioning/wiring method of this type. Referring to FIG. 1, according to a popular positioning/wiring method, pads (chip terminals) 45 are arranged on the outermost peripheral portion of a chip 41h, input/output buffers 42d are arranged inside the pads 45, and desired functional circuits (to be referred to as internal circuits hereinafter) are arranged in a remaining inner region 62. A software algorithm for a CAD tool for performing automatic positioning/wiring processing has been studied on the basis of this positioning/wiring method.

In this method, the input/output buffers 42d are not arranged together with internal circuits arranged in the internal circuit region 62 in an automatic positioning process, and only the manner of arranging the input/output buffers 42d at specific one-dimensional positions in the peripheral region of the chip 41h must be considered. Therefore, a positioning technique different from that for positioning of blocks on a two-dimensional surface in an internal circuit block layout position definition step (step 75) for the internal circuit region 62 is used for positioning the input/output buffers 42d.

A conventional design procedure will be described with reference to the flow chart of FIG. 2. After an operation check on function description data on the function level is completed in function level simulation (step 71), logic synthesis is performed (step 72), and the resultant data is converted into circuit diagram data having circuit blocks as constituent elements (step 73). The size of an LSI chip is calculated from the circuit diagram data (step 74). In addition, as shown in FIG. 1, the layout positions of the input/output buffers 42d and layout positions 63 of internal circuit blocks are defined independently on the basis of the calculated size (step 75).

The input/output buffers and the internal circuit blocks are arranged (step 77) in a floor plan formation process (step 76) in accordance with the layout position definitions.

An internal circuit block 43a (consisting of 12 cells) in FIG. 1 is one of the internal circuits arranged in this manner. The wiring lengths between the internal circuit blocks are temporarily determined on the basis of this floor plan, and inappropriate paths are extracted by timing simulation (step 79). The floor plan is corrected to eliminate the inappropriate paths on the basis of the extraction result, and automatic positioning/wiring of all the circuits is executed on the basis of the floor plan (step 80). Actual wiring length timing simulation (step 81) is performed between the automatically positioned/wired circuits. If there is an inappropriate path, the layout is finely adjusted again to output mask data.

Consider the relationship between the size of an internal circuit of an ASIC and the number of chip terminals. With the advances in process techniques, the circuit size per unit area has increased almost double for each technology generation with a reduction in design rule and formation of multilevel interconnections. In contrast to this, the number of chip terminals based on wire bonding increases as the bonding tools improve and the pitch of bonding pads decreases. However, this increase in the number of chip terminals does not match the increase in the density of internal circuits. As a result, the number of chip terminals per circuit size decreases steadily for each technology generation.

Consider the possibility of improvement in the above point in conventional techniques associated with methods of arranging input/output buffers and chip terminals as well as ASICs. Japanese Unexamined Patent Publication No. 3-97238 discloses an example of the possibility. This gazette shows the idea of arranging chip terminals outside and inside an input/output buffer layout region on the periphery of a chip (see FIG. 1 in the gazette). In this case, a film carrier having inner leads is considered as a connection means in place of wire bonding.

Another example is disclosed in Japanese Unexamined Patent Publication No. 2-244755. This gazette discloses a case wherein two rows of input/output buffers are arranged on the periphery of a chip in a stacked state (see FIGS. 1 and 2 in the gazette). In this case, chip terminals are connected by a bonding technique. As shown in FIG. 2 in the gazette, in particular, the structure in which pads are also arranged in two rows is realized as a stereoscopic structure by changing the height of each bonding wire.

Still another example is disclosed in Japanese Unexamined Patent Publication No. 4-196464. This gazette discloses a case wherein arrays of input/output pads are arranged at predetermined intervals on transistors in a chip and on a wiring region surface (see FIG. 1 in the gazette). However, the gazette discloses no specific positions of input/output buffers and no specific method of connecting the input/output pads as chip terminals to an external unit.

Still another example is disclosed in Japanese Unexamined Patent Publication No. 4-357849. This gazette discloses a case wherein solder balls are formed as chip terminals on the entire surface of a chip in the form of arrays to perform flip-chip bonding (see FIGS. 1 and 2 in the gazette). The gazette discloses nothing about the positions of element on the chip.

Each of the above conventional techniques has the following drawbacks from the viewpoint of ASICs. First of all, in the conventional ASIC positioning/wiring method, since input/output buffers are arranged on the peripheral portion of a chip, the number of input/output buffers and the size of an internal circuit are uniquely determined as relative amounts by the size of each cell and a chip size.

If, for example, the size of an internal circuit is large, the length of the peripheral portion becomes long, and many input/output buffers can be arranged. If, however, the number of input/output buffers required for the LSI is small as compared with the size of the internal circuit, a space is produced in the peripheral portion. In contrast to this, if the size of the internal circuit is small, and the number of input/output buffers is relatively large, a space is produced in the internal circuit region, although the length of the peripheral portion increases for input/output buffers. In either case, the chip size includes a space, and hence the chip cost becomes high as compared with a case wherein no space is included.

In order to reduce the formation of such a space, an internal circuit may be arranged to partly protrude into a space on the peripheral portion, and rows of input/output buffers may be stacked in a space in the internal circuit region. In the ASIC technique, however, an automatic positioning/wiring tool must be effectively applied to such a structure.

Consider the above space reducing methods from such a viewpoint. In the former case, interconnections cannot be effectively arranged on a convex portion of the internal circuit region which protrudes into the peripheral portion of the chip. This is because the existing algorithms for tools are based on the premise that an overall internal region is rectangular.

In the latter case, since the density of chip terminals arranged near input/output buffers increases, it is difficult to perform packaging by a wire boding method which is generally used at present and hence is low in cost. For this reason, an algorithm for stacked rows of input/output buffers is not used for general ASIC products, and there is no general automatic position/wiring tool based on this structure.

That is, the layout structures of various chips, which have been proposed as an effective means for increasing the density of chip terminals, cannot be applied to ASICs, one of the features of which is automatic design, unless a new automatic process tool based on these structures is developed. In designing an ASIC chip with a higher area efficiency, the above limitations are posed in the conventional techniques.

SUMMARY OF THE INVENTION

The present invention has been made in consideration of the above situation in the prior arts, and has as its object to provide a positioning/wiring method which facilitates design automation of an ASIC having a flip-chip structure by increasing the degree of freedom of input/output buffer arrangements without degrading a basic algorithm for conventional automatic positioning/wiring tools.

In order to achieve the above object, according to the basic aspect of the present invention, there is provided an automatic positioning/wiring method for a flip-chip semiconductor device which is adapted to design a semiconductor chip including test pads used for inputting/outputting signals in a test, chip terminals respectively arranged on or near the test pads to serve as input/output terminals for an external unit, input/output buffers for exchanging signals with the external unit, and internal circuit blocks which perform predetermined circuit operations in response to signals from the input/output buffers, comprising the steps of positioning/wiring the internal circuit blocks and the input/output buffers in arbitrary regions on the semiconductor chip in an automatic positioning/wiring design process on the basis of a result of a layout position determination process for performing definition such that the input/output buffers and the internal circuit blocks are arranged without discrimination layout regions thereof, and performing a floor plan formation process to arrange the input/output buffers into predetermined groups within the arbitrary region in the form of rows each parallel to one of sides of the semiconductor chip.

In the basic aspect, the layout position determination process and the floor plan formation process comprise the buffer division step of dividing the input/output buffers into a plurality of groups in advance in accordance with a plurality of power supply lines which are electrically independent of each other, the layout position definition step of defining block layout positions to commonly arrange the input/output buffers and the internal circuit blocks on a surface of the chip without discriminating the input/output buffers and the internal circuit blocks, the approximate arrangement step of approximately arranging the input/output buffers in each of the groups in the form of a row at an arbitrary position along a direction of a main axis parallel to one side of the semiconductor ship or a direction of a sub-axis parallel to the other side of the semiconductor chip by using the layout position definition in an automatic positioning/wiring design process, the rearrangement step of, when a length of one of the rows of the input/output buffers exceeds a length of one side of the semiconductor chip, performing layout position adjustment by further dividing the row of the input/output buffers into small groups such that all the input/output buffers are distributed and belong to the small groups in the form of rows, the power supply wiring step of wiring/connecting the power supply feed lines, which are respectively constituted by pairs of power supply lines and electrically independent of each other, to the input/output buffers belonging to the plurality of small groups in the form of rows having undergone the layout position adjustment, and the overall positioning/wiring step of performing automatic positioning/wiring of the overall chip by using layout data of the input/output buffers belonging to the plurality of small groups in the form of rows having undergone the layout position adjustment.

In this method, the rearrangement step comprises the step of performing insertion/positioning of at least a pair of power supply test pads or the pair of test pads and chip terminals which are connected to the pair of power supply lines in each of the plurality of groups in the form of rows by performing layout position adjustment of the input/output buffers, and when a length of one of the rows of the input/output buffers exceeds a length of one side of the semiconductor chip upon the insertion/positioning, performing layout position adjustment by further dividing the row of the input/output buffers into small groups such that all the input/output buffers are distributed and belong to the small groups.

This method further comprises the macro data creation step of creating macro data required to handle each of the input/output buffer groups arranged in the form of rows upon layout position adjustment in the rearrangement step as one macro data in the automatic positioning/wiring process, each of the groups including the pair of power supply lines and at least a pair of power supply chip terminals connected to the power supply lines, and the automatic positioning/wiring step of performing an automatic positioning/wiring process of the overall semiconductor chip by setting layout position data of the input/output buffer groups having undergone the layout position adjustment as initial arrangement data of the macro data, and using the macro data.

In this method, when the plurality of input/output buffer groups in the form of rows are arranged on at least one side of the semiconductor chip, and the power supply chip terminals or signal chip terminals included in the groups are arranged in a corner region, at least one parallelizing bump is formed in each of remaining corner regions to maintain a parallel state between the semiconductor chip and a predetermined mounting board in mounting the semiconductor chip on the mounting board with the chip facing down.

In this method, the plurality of input/output buffer groups in the form of rows, and the internal circuit blocks are arbitrarily positioned/wired together in a region including a peripheral portion on the same semiconductor chip.

In this method, the internal circuit blocks are arranged in a region including a peripheral portion on the same chip, the plurality of input/output buffer groups in the form of rows are positioned/wired at arbitrary positions in a region inside the peripheral region, and the parallelizing bumps are arranged in the chip corner regions.

In this method, first block layout position definition with a small pitch is performed for a predetermined internal region in the same semiconductor chip, block layout position definition with a pitch corresponding to an integer multiple of the block pitch of the first block layout position definition is performed for a peripheral region surrounding the predetermined internal region, the plurality of input/output buffer groups in the form of rows in which the input/output buffers each having a first block size corresponding to an integer (including 1) multiple of an integer multiple of the block pitch and second input/output buffers each having a size corresponding to a rational number multiple of the first block size are arranged together are positioned/wired in the peripheral region surrounding the predetermined internal region, the internal circuit blocks are arranged at arbitrary positions in the predetermined internal region, and the plurality of input/output buffer groups in the form of rows constituted by the input/output buffers having the first block size are also positioned/wired among the internal circuit blocks.

In this method, coordinates of probe tips of a probe card may be standardized, the chip terminals of the semiconductor chip may be arranged at positions corresponding to the standardized coordinates regardless of a chip size, and the plurality of input/output buffer groups in the form of rows may be positioned/wired in correspondence with the pad positions.

In this method, the chip terminals corresponding to the test pads may be arranged in a staggered pattern in a peripheral region of the region in which the test pads are arranged, and may be wired to the test pads.

As is apparent from the above aspects of the present invention, a common layout position definition is used for an input/output buffer layout portion and an internal circuit layout portion without discriminating them, and a plurality of input/output buffers based on the common layout position definition are arranged in rows along the automatic installation direction of signal wiring layers. In addition, a power supply system for supplying power to the input/output buffers is divided into a plurality of systems electrically independent of each other on the chip, as needed, to maintain such a one-row rule. Therefore, the function of the conventional ASIC automatic positioning/wiring process tool which is used to process an internal circuit portion is used as a design tool for the overall chip including the input/output buffers, thereby allowing this function to be applied without changing the basic algorithm. As a result, input/output buffers can be arranged with a very high degree of freedom which cannot be realized by the conventional ASIC automatic design method, and a form having chip terminals arranged in the entire semiconductor chip region at a high density can be realized by a automatic design method. Since spaces which tend to be produced by the unbalance between the number of input/output buffers and the size of an internal circuit can be reduced, the cost of the chip in such a case can be reduced. In addition, the degree of freedom in chip design to obtain good characteristics and high performance including various environments on a mounting board can be increased. Furthermore, standardization of a test jig (the chip-side probes of a probe card) is further facilitated. In addition, connection of power supply wiring layers to the rows of the input/output buffers can be easily performed as part of a macro block design process without routing wiring layers that is, according to the present invention it is unnecessary to rout power supply wiring layers so as to connect those to the input/output circuit blocks placed here and there on the chip even if the degree of freedom in the layout positions of the input/output circuit blocks is increased, in spite of the increase in the degree of freedom in the layout positions of the input/output buffers as the overall semiconductor chip, thereby explicitly indicating the possibility that the intra-macro-block wiring process itself can be automated.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF THE PREFERRED EMBODIMENTS

Figure 2:
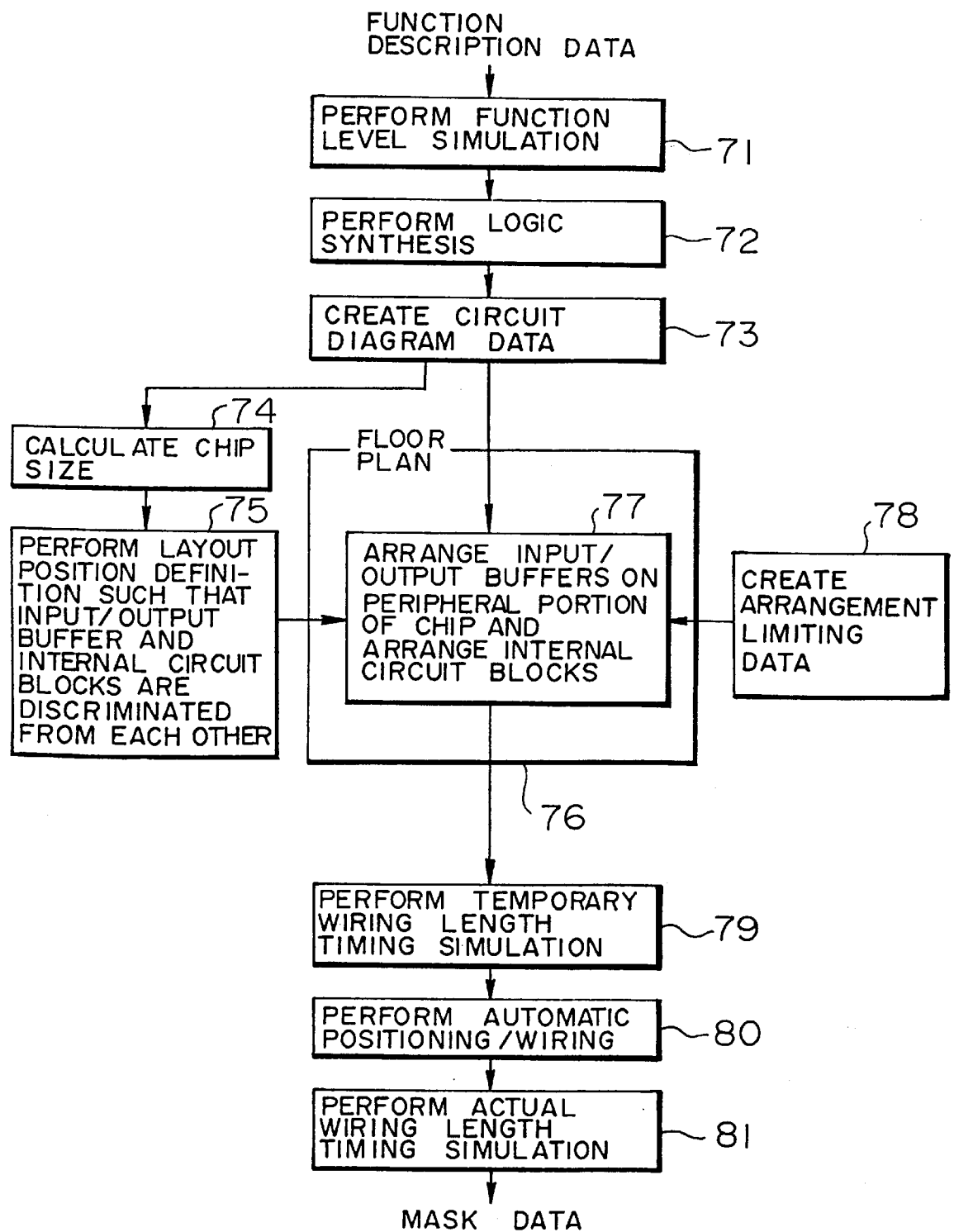
FIG. 2 is a flow chart showing a conventional positioning/wiring design procedure.
Figure 3:
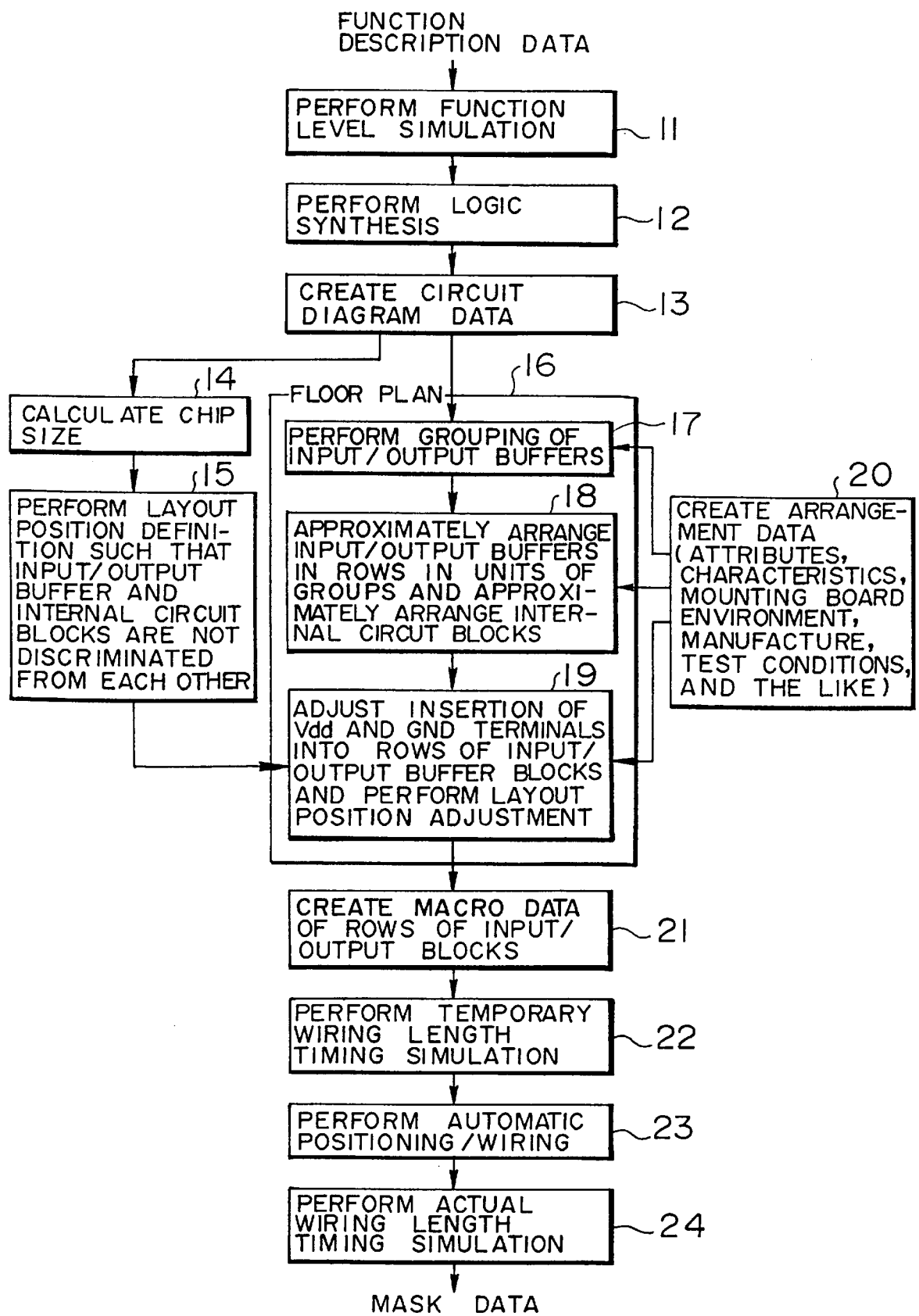
FIG. 3 is a flow chart associated with an embodiment of the present invention.

Several preferred embodiments of the present invention will be described below with reference to the accompanying drawings. FIG. 3 is a design flow chart of an embodiment of the present invention. The steps enclosed with the thick solid lines in FIG. 3 are different from those in the prior art described with reference to FIG. 2, and constitute the main part of the present invention. This main part will be mainly described below. First of all, function description data is subjected to function level simulation (step 11) to check operations on the function level. Logic synthesis (step 12) is then performed to convert the data into circuit diagram data having circuit blocks as constituent elements (step 13). A chip size is calculated on the basis of this circuit diagram data (step 14). Thereafter, layout position definition processing (step 15) is performed on the chip such that input/output buffers and internal circuit blocks are not discriminated from each other.

Figure 4:
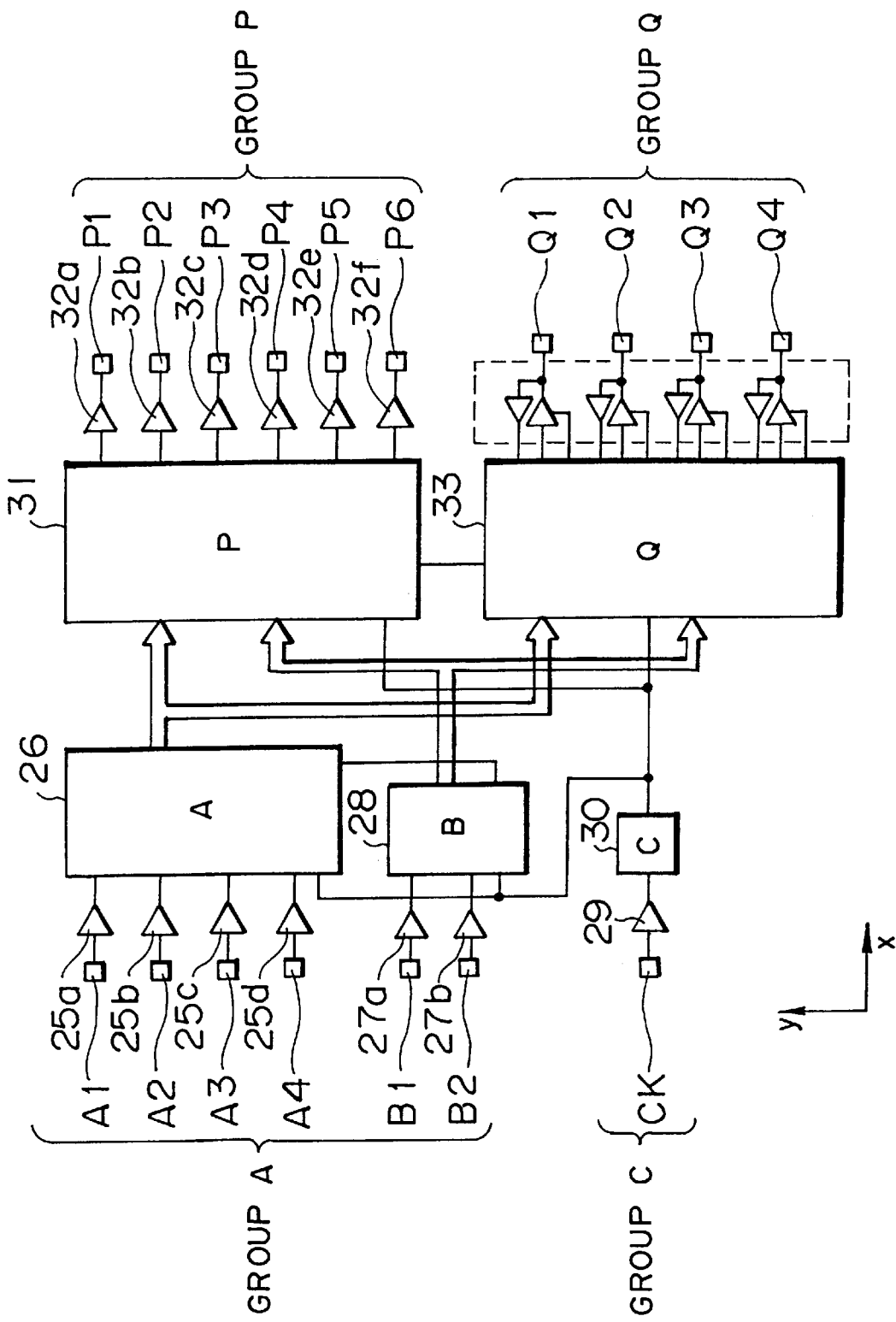
FIG. 4 is a block diagram showing an LSI circuit which can be handled in the embodiment of the present invention.

FIG. 4 shows an example of various LSI circuits which can be handled by this embodiment. Referring to FIG. 4, each of blocks 26, 28, 30, 31, and 33 is constituted by a large number of primitive blocks having basic logic functions such as NAND, NOR, EX-OR, and flip-flop functions. The blocks 31 and 33 also include large-scale memory blocks (not shown).

The block sizes of these blocks, input buffers 25a to 25d, 27a and 27b, and 29 respectively connected to terminals A1 to A4, B1, B2, and CK, output buffers 32a to 32f respectively connected to output terminals P1 to P6, and bidirectional buffers QN connected to output terminals Q1 to Q4 are set in the x and y directions with integers by using the minimum partition unit, called a cell, on the layout as the reference.

The numbers of cells of the respective blocks are added together throughout all the circuits, and empirically determined necessary areas such as the areas of wiring regions required for connection between these blocks and the area of a power supply wiring region are also added, thus executing chip size calculation (step 14).

Figure 5:
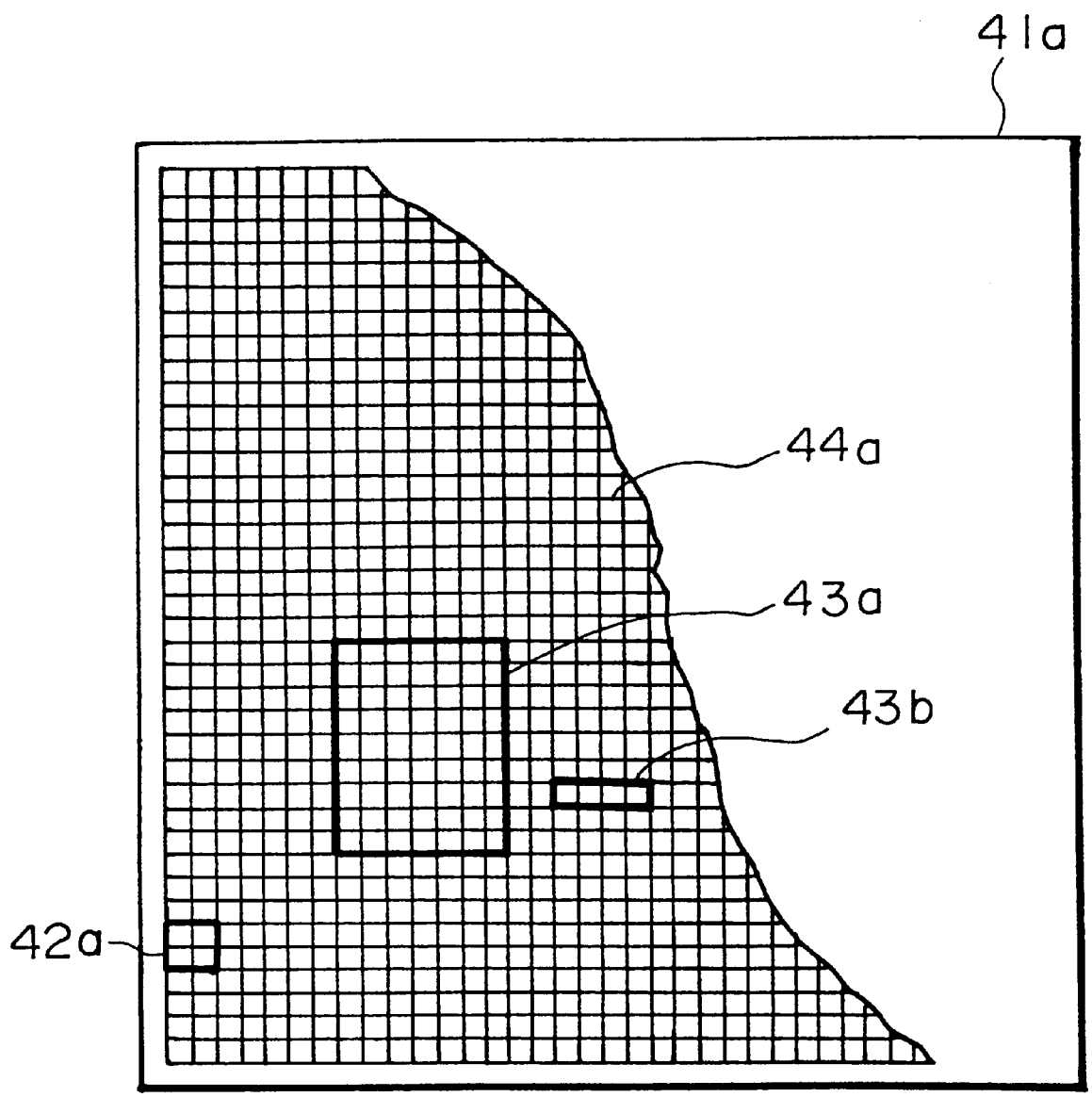
FIG. 5 is a plan view showing part of the result of partition definition using a cell as the minimum unit in the embodiment of the present invention.

FIG. 5 is a plan view showing the result of partition definition using a cell as the minimum unit. When a chip size is determined, the above partition definition processing using a cell as the minimum unit (step 15) is performed on the entire surface of the chip on the basis of the chip size. The mesh-like partitions constitute orthogonal coordinates using a cell as the minimum unit. Internal blocks 43a land 43b and an input/output buffer 42a are arranged with a partition as the minimum unit. This partition definition is the layout position definition of blocks.

Figure 1:
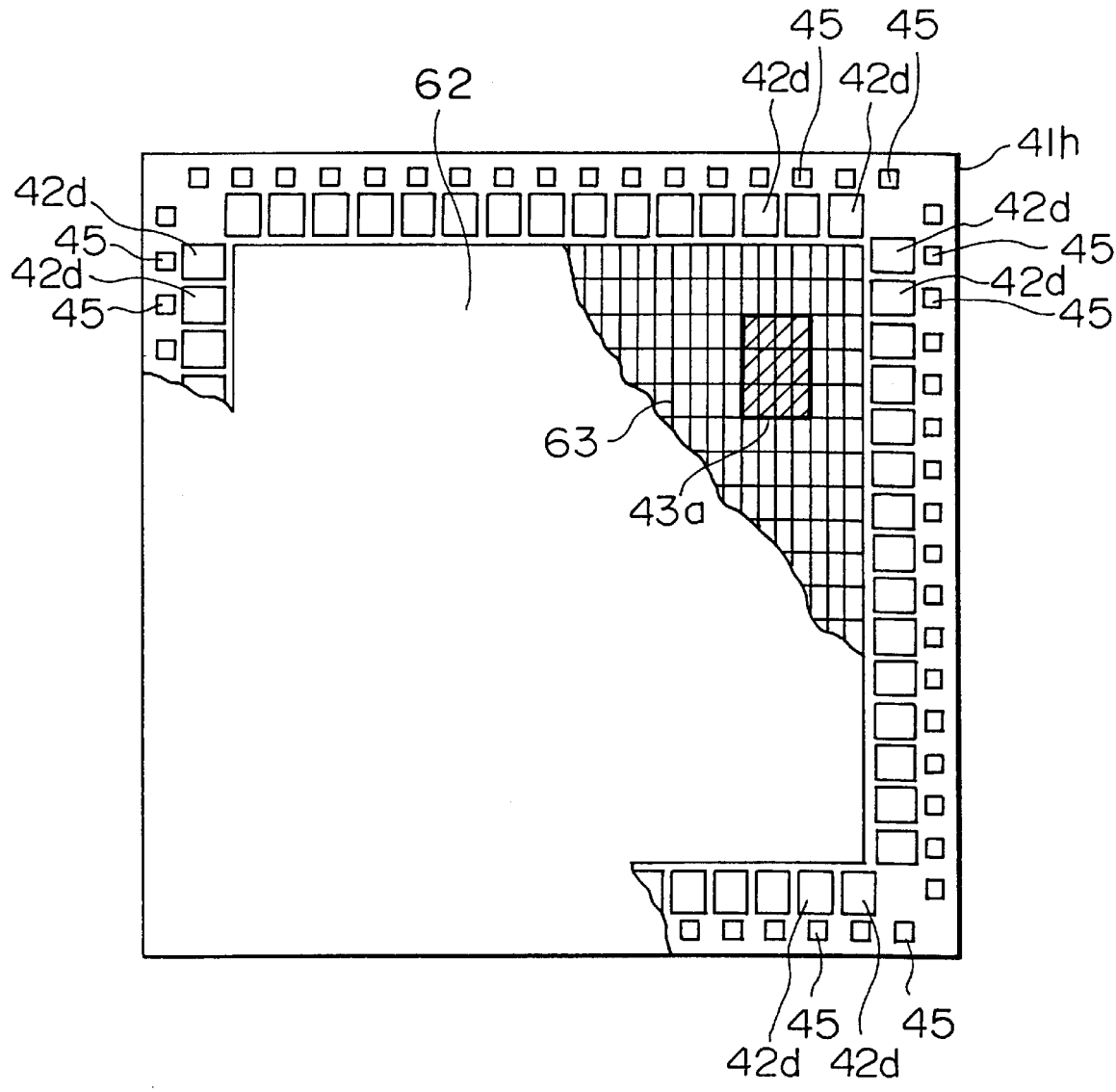
FIG. 1 is a plan view showing part of a conventional layout of gate arrays and cell base ICs on the upper surface of an ASIC chip.

In the present invention, there is no discrimination between the input/output buffer blocks and the internal circuit blocks, and a block layout position definition region 44a is commonly present for both types of blocks, unlike the prior art shown in FIG. 1, in which the layout positions of the input/output buffer blocks 42d are discriminated from the internal circuit layout positions 63.

For example, the input/output buffer 42a in FIG. 5 is an input/output buffer to be positioned on the coordinates based on this definition, and the internal circuit blocks 43a and 43b are two types of internal circuit blocks having different sizes and positioned on the same coordinate axes.

In the above process, grouping of the input/output buffers, i.e., buffer division processing, (step 17) is performed in the floor plan formation process (step 16). This grouping is performed in consideration of matching between operation timings, signal interference, the positional relationship between terminals on a board on which chips are mounted, a manufacturing process, a test environment, and the like. With this grouping, the input/output buffers are grouped into a group of input/output buffers which can be connected to a pair of power supply potential (Vdd) and ground potential (GND) which are electrically connected to each other, and a group of input/output buffers which should be connected to another pair of Vdd and GND which are electrically separated from the above pair of Vdd and GND. Even input/output buffers which can be connected to a pair of Vdd and GND may be included in different groups depending on the positional relationships between terminals to be mounted.

The minimum number of groups is obtained as the result of the above step if all the input/output buffers are preferably positioned near to each other, and can be connected to a pair of Vdd and GND. In this case, the number of groups is one. In the LSI circuit shown in FIG. 4, when the six buffers 32a to 32f, which are connected to the output terminals P1 to P6, and the four bidirectional buffers QN, which are connected to the terminals Q1 to Q4 independently of the buffers 32a to 32f, are simultaneously switched on at a certain signal combination timing, the potentials of the pair of Vdd and GND greatly vary owing to large changes in currents instantaneously flowing in the buffers. In order to prevent other groups from being influenced by such variations in potential, the input/output buffers are grouped as follows.

The input buffers 25a to 25d, 27a, and 27b for receiving input signals via the input terminals A1 to A4, B1, and B2 constitute one group. The input buffer for receiving a clock signal via the terminal Ck is an independent group by itself. The output buffers 32a to 32f connected to the terminal P1 to P6 constitute one group. The bidirectional buffers QN connected to the terminals Q1 to Q4 constitute one group. That is, these buffers are grouped into a total of four groups.

Referring to FIG. 4, these blocks obtained by such grouping are referred to as groups A, C, P, and Q.

Subsequently, a floor plan of the input/output buffers and the internal blocks is produced. In this process, the specific positions of the input/output buffers on the chip are determined in accordance with items to be considered in the grouping step (step 17) for the input/output buffers. At the same time, positional relationships are obtained as follows (steps 18 to 20). A relative positional relationship between the blocks which is associated with a so-called critical path is determined to shorten the signal transmission time in the overall LSI circuit including the input/output buffers and the internal circuits. In addition, a positional relationship is determined in consideration of signal interference, noise interference, limitations on the manufacturing process and tests, and the like. Furthermore, a positional relationship is determined to have a good balance between the position of a large block such as a memory block and the desired positions of the input/output buffers if any large block is present, and to prevent wiring failures in the subsequent automatic positioning/wiring step.

After the input/output buffers are grouped in the above manner, the input/output buffers in each group are approximately arranged in a row (step 18). Strictly speaking, these buffers are arranged in a row in the major axis direction in wiring installation in the automatic positioning/wiring step or the sub-axis direction perpendicular to the major axis direction. In general, the directions of the input/output buffers in the respective groups coincide with two orthogonal directions along chip sides.

The length of a row of input/output buffers may exceed the length of a side (the total length or width of the block layout position definition region 44a in FIG. 5) of the chip on which these input/output buffers can be placed. In such a case, one corresponding group is divided into small groups, and the buffers in each small group are rearranged in a row.

The blocks whose layout positions are set in the floor plan formation process (step 16) are the input/output buffers and internal circuit blocks subjected to above considerations. Other blocks are handled in the subsequent automatic positioning/wiring step. As in the above layout position definition step (step 15), there is no discrimination between input/output buffer blocks and internal circuit blocks in the floor plan formation process.

In the embodiment of the present invention, required numbers of GND and Vdd terminals are inserted in each row of input/output buffers. In this embodiment, test pads (denoted by reference numerals 45) used for a wafer test are placed near the respective input/output buffers, and ball bumps (chip terminals denoted by reference numerals 46) for chip mounting are formed on the test pads. The ball bumps serve to electrically connect the chip to the board in a mounting process. If Vdd and GND terminals are positioned/wired in each row of input/output buffers, the routing distances of power supply wiring layers can be decreased, and circuit design is facilitated.

In the embodiment of the present invention, strictly speaking, to arrange input/output buffers in a row is to arrange the ball bumps of the input/output buffers and Vdd and GND ball bumps in a row in accordance with the arrangement pitch of electrodes on a mounting board which are connected to the ball bumps. When power supply or signal chip terminals are to be inserted between input/output buffers, the input/output buffers must be moved to ensure spaces for the terminals. Layout position adjustment is therefore required.

When the length of one row exceeds the length of one side of the chip upon insertion of such chip terminals, in particular, the row is divided into small groups, and the layout positions of the input/output buffers in each small group are adjusted to be arranged in a row. The potentials Vdd and GND may be commonly applied to a plurality of small groups obtained in the above step, or new Vdd and GND terminals may be added to the groups by the above method to make the respective groups electrically independent.

Note that the required numbers of GND and Vdd terminals and their insertion positions are mainly determined by the number of output buffers to be simultaneously switched on, their load driving abilities, and the magnitude of their driving loads.

With the above step, all the steps in the floor plan formation process (step 16) in FIG. 3 are completed. For the sake of descriptive convenience, the above description is made as if the steps in the floor plan formation process were performed in a predetermined order. In practice, however, these steps may be performed in various orders depending on objects to be designed, and hence the order of steps is irrelevant to the present invention.

Figure 6:
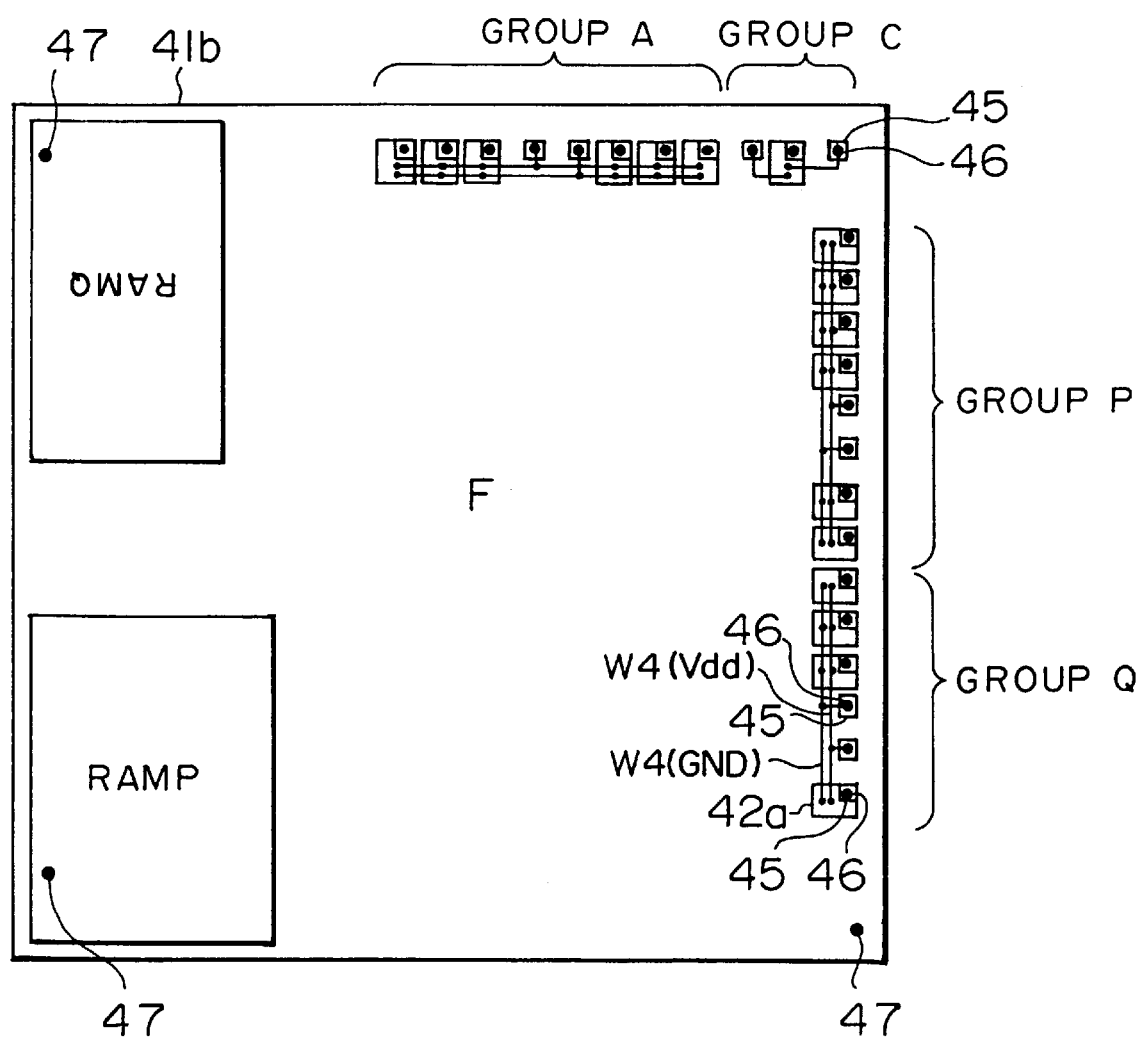
FIG. 6 is a plan view showing the result of a floor plan formation process performed for the circuit shown in FIG. 4.

FIG. 6 shows a floor plan obtained by executing the above floor plan formation process with respect to the circuit shown in FIG. 4. Although FIG. 6 shows the state of a portion having undergone the subsequent macro data creation step, the result of the floor plan formation process is not influenced by this portion. The floor plan in FIG. 6 strongly reflects a mounting environment for the chip in FIG. 7, which is a plan view of a chip-mounting board. Since this chip is positioned at the upper right corner of the mounting board in FIG. 7, it is rational in terms of design that chip terminals are gathered on the chip sides on the opposite side to the upper right corder. In order to make the floor plan reflect this state, the input/output buffers are gathered on the right and upper sides of the chip in FIG. 6.

Figure 7:
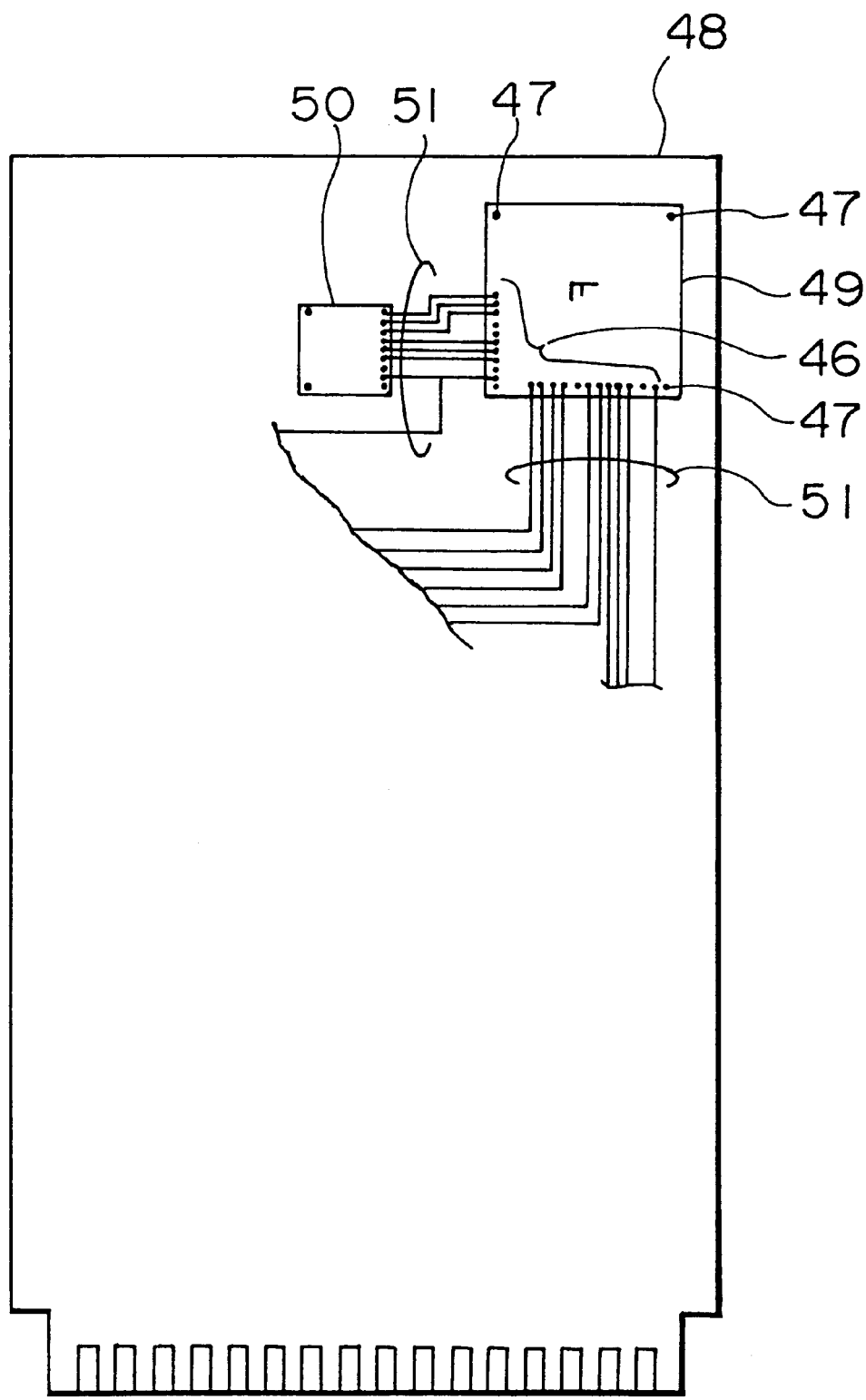
FIG. 7 is a plan view showing part of a mounting board for a semiconductor ship.

Referring to both FIGS. 6 and 7, the letter "F" in the center of the chip indicates the positioning direction of the same chip in the two drawings. FIG. 6 shows a state wherein the direction of the element formation surface coincides with that of the upper surface of the drawing. FIG. 7 shows a state wherein the element formation surface is reversed with the flip-chip being mounted.

The rows of input/output buffers including Vdd and GND terminals are indicated by the groups A, C, P, and Q on the upper and right sides in FIG. 6. The respective groups correspond to the groups denoted by the same reference symbols in FIG. 4.

In this circuit, there is no input/output buffer row whose length exceeds the length of one side of the chip, and hence no row of input/output buffer is not divided into small groups. RAM blocks respectively included in the functional portions of the groups P and Q in FIG. 4, which are parts of internal circuit blocks, are designated for positioning on the left side of the chip surface in FIG. 6. These blocks are placed on corners of the chip so as not to interfere with connection of intra-chip signal wiring layers. At the same time, the signal terminals of the blocks are present on only the upper sides in the direction in which the letters "RAMP" and "RAMQ" can be read, and are directed toward regions in which other primitive blocks are arranged, thereby facilitating wiring connection with the blocks.

In the next step, macro data creation (step 21) is performed to create data required to handle each input/output buffer in one row including Vdd and GND terminals as one macro data. First of all, Vdd and GND wiring connection is performed between the input/output buffer and the power supply pads in each of the groups A, C, P, and Q in the form of rows.

The group Q to which the terminal Q1 belongs will be described as an example with reference to FIG. 8, which is a positioning/wiring diagram of the bidirectional buffers QN. The Vdd and GND chip terminals 46 are connected to the Vdd and GND connection terminals of the input/output buffers 42a by mainly using a fourth wiring layer. More specifically, a third wiring layer W3 is used through a third-fourth wiring layer through hole 52 at a portion where Vdd and GND cross each other, e.g., at a portion between a fourth Vdd wiring layer W4 (Vdd) and its chip terminal. A fourth GND wiring layer W4 (GND) passes on this portion.

Figure 8:
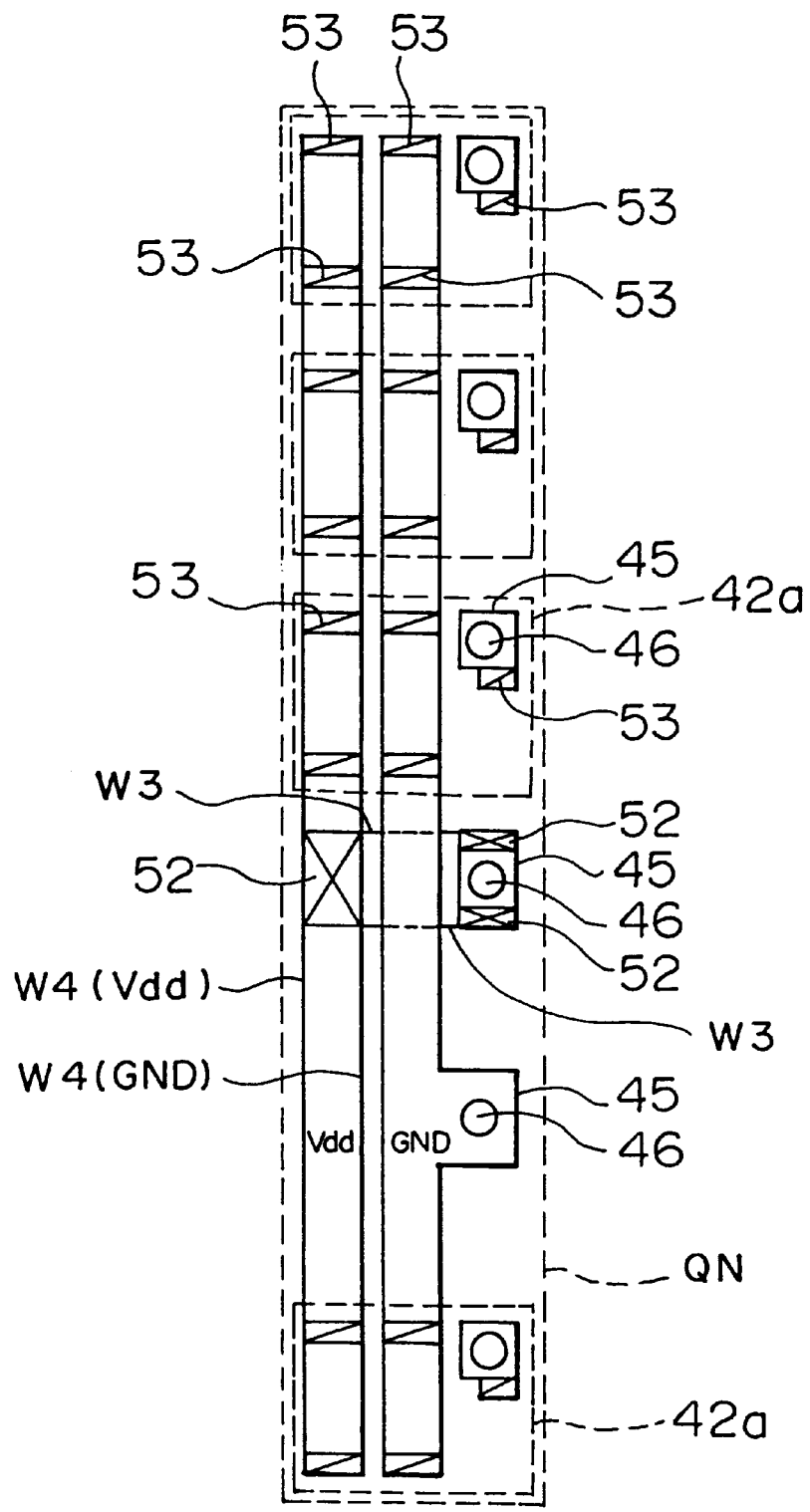
FIG. 8 is a plan view showing a layout of bidirectional buffers QN.

The intra-block circuit of each input/output buffer 42a is constituted by the first and second wiring layers (not shown in FIG. 8 for the sake of simplification). At a connection terminal portion among the Vdd and GND wiring layers and a connection portion with a test pad 45, the second wiring layer in each intra-block circuit is connected to the fourth Vdd and GND wiring layers W4 (Vdd) and W4 (GND) or the test pad 45 via through hole 53.

In this case, the "through hole" has a structure in which the third wiring layer W3 is present at an intersecting portion where the second and fourth wiring layers are to be connected to each other, and the second and third wiring layers or the third and fourth wiring layers are connected to each other.

A solder ball is formed on each test pad 45 via a barrier metal. This solder ball serves as the ball bump (chip terminal) 46.

The overall QN portion enclosed with the dotted line frame in FIG. 8 is one hard macro data, and is termed as QN in the circuit diagram in this case. The circuit diagram data in FIG. 4 also reflects this term. The four bidirectional buffers connected to the terminals Q1 to Q4 in FIG. 4 are rewritten into one block QN enclosed with the dotted line as circuit diagram data in step 21. In the subsequent design step, one macro block data termed as QN is processed instead of each bidirectional buffer data.

With the above macro data creation step, since the block QN is present in the circuit diagram in FIG. 4, art work data including bidirectional buffer data, power supply wiring data, chip terminal data, and the like which are created in the step of creating the above macro block data are automatically added to the art work data of the entire chip when symbolic data in the process of design such as block form data, intra-block terminal position data, including this circuit diagram data, is finally converted into mask formation data.

That is, the above Vdd and GND wiring connection processing need not be performed on the level of the entire chip data having an enormous data amount. In addition, as is apparent, power supply connection processing for the remaining groups, i.e., the groups A, C, and P, is performed in the same manner.

Furthermore, the hard macro data set in step 21 can be moved to a more appropriate position in the automatic positioning/wiring step (step 23) in FIG. 3 by using the layout position of each input/output buffer set in the floor plan formation process (step 16) as an initial value, although this processing is not performed in this case. FIG. 6 shows the input/output buffer groups in a state wherein such hard macro data creation step is added. Referring to FIG. 6, each of the Vdd and GND wiring layers is expressed by one straight line.

In the flow chart shown in FIG. 3, the lengths of signal wiring layers between the respective blocks are predicted on the basis of the floor plan data, and temporary wiring length simulation is performed by using the corresponding electrical load amounts (step 22). In this step, it is checked whether the LSI circuit operates as expected. If there is a problem, the flow returns to a previous step (not shown) in solving the problem. After correction is performed, it is checked again whether the LSI circuit properly operates.

After the operation is checked, the flow advances to step 23 to perform automatic positioning/wiring processing. In this step, in addition to the blocks whose layout positions are designated in the above floor plan formation process (more specifically, this designation processing includes two types of designation processing, i.e., absolute position designation and relative position designation), the layout positions of the remaining blocks which have not undergone designation are determined, thus determining the layout positions of all the blocks. In this state, automatic connection of the signal lines between the block terminals is performed.

In this step, all the actual wiring lengths are determined, and hence the operation of the LSI circuit is checked by actual wiring length timing simulation in consideration of the electrical load amounts of the wiring layers (step 24). If there is a problem, the flow returns to the previous step to solve the problem. The required process is repeated until the proper operation of the LSI circuit is determined.

After this step, the symbolic data used in the previous steps is completely converted into art work data for mask formation, and the mask formation step is started.

Figure 9:
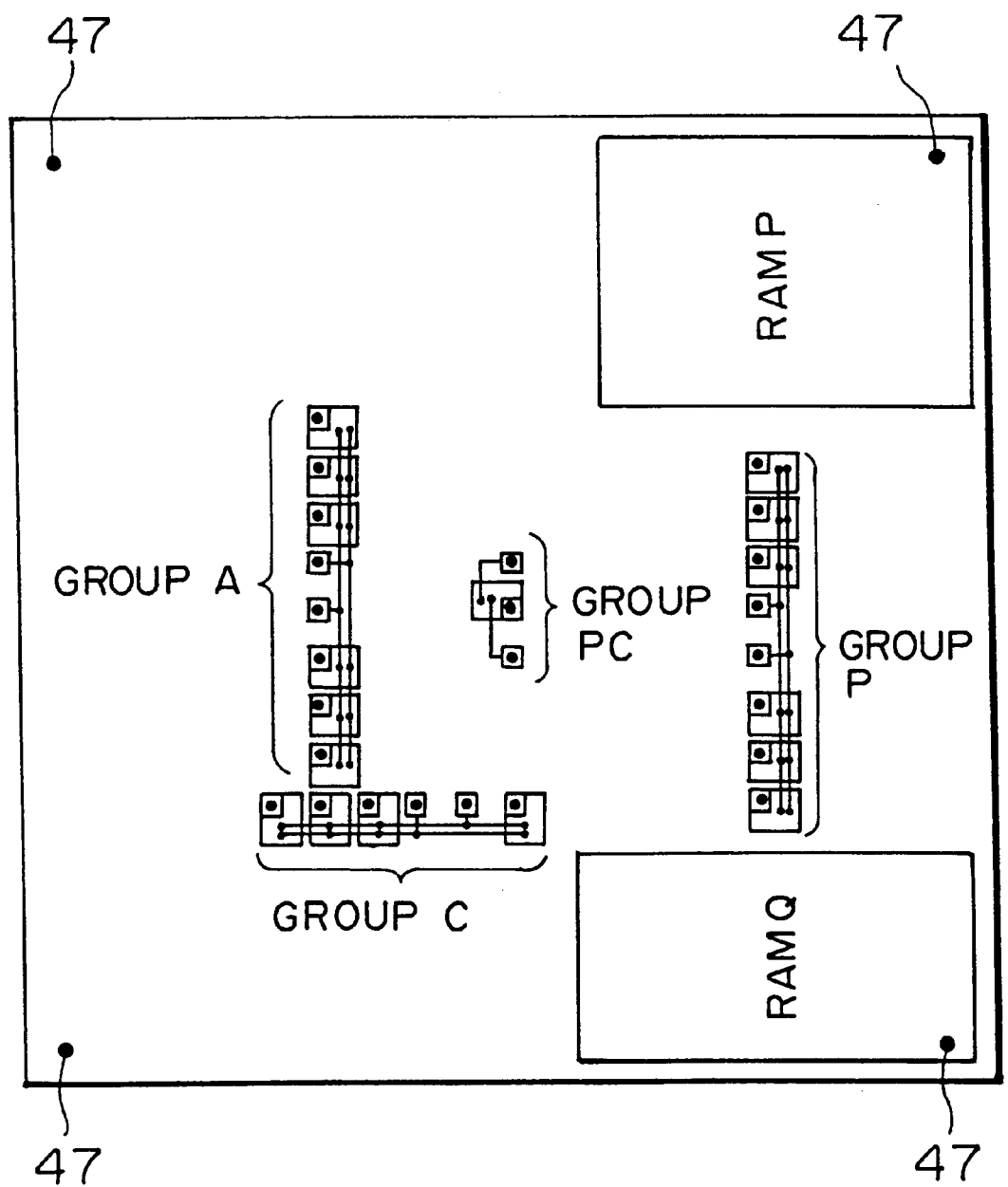
FIG. 9 is a plan view showing another floor plan formation process executed for the circuit shown in FIG. 4.

FIG. 9 shows another example of the positioning/wiring result which corresponds to the circuit in FIG. 4 using the design flow chart in FIG. 3 but different from the positioning/wiring result in FIG. 6. Referring to FIG. 9, in this example, the chip is mounted on the central portion of the mounting board unlike the board mounting environment shown in FIG. 7. In order to obtain performance on the desired board level, the lengths of wiring layers in the chip are preferably optimized rather than decreasing the lengths of wiring layers on the board. For this reason, as the result of a chip-performance-oriented floor plan formation process, the layout positions of input/output buffers are completely different from those in the above case.

"RAMP" and "RAMQ" are arranged at the upper right position and the lower right position in FIG. 9, and the group C in FIG. 4 which includes the input buffer 29 for a clock signal is positioned in the center of the chip to facilitate equalization of transmission times of clock signals transmitted into the chip and minimization of the delay times of the clock signals.

According to the forms employed by the conventional ASIC scheme, it is not conceivable that input/output buffers are laid out inside the chip. However, according to the positioning/wiring method of the present invention, such a form can be realized by using various tools developed for conventional ASICs. This is because the procedure for processing internal regions using the conventional tools can be applied to input/output buffers by performing layout position definition with respect to the entire chip surface. In addition, since a layout including blocks having different sizes, such as a memory block, has been handled in an internal region, input/output buffers can be regarded as such blocks.

Chip surface parallelizing ball bumps 47 in FIGS. 6 to 8 are balancing balls to keep parallelizing the chip surface and the mounting board surface. These ball bumps 47 are formed for the following reason. When the flip-chip is mounted on the mounting board by a reflow process with the chip facing down, since only molten solder balls are present between the chip surface and the mounting board surface, the two surfaces, i.e., the chip surface and the mounting board surface cannot be automatically kept parallelized if the solder balls 46 are present on only the two sides of the chip, as shown in FIG. 6.

According to a method of forming such a ball, a solder ball is formed on a pad formed on the fourth wiring layer via a barrier metal as in the case shown in FIG. 8. Although this ball bump 47 need not always be an electrode, a ball bump serving as an electrode may be used in place of the solder ball. The ball bump 46 on the right end of the group C located at the upper right position in FIG. 6 can be regarded as a ball bump serving both as a power supply ball bump and a ball bump for keeping parallelizing the chip surface. In the case shown in FIG. 9, the ball bumps 47 are positioned on all the four corners of the chip. Since the first and second wiring layers including the third wiring layer (not shown) are electrically insulated from each other, such ball bumps can be formed on elements. The parallelizing ball bumps 47 are arranged on "RAMP" and "RAMQ", as shown in FIGS. 6 and 7.

With regard to the chip layout shown in FIGS. 6 and 8, there is no description of a method of supplying power to the internal circuits. For example, according to a conventional power supply wiring design method, a surrounding power supply wiring pattern is arranged around macro blocks such as memory blocks and connected at a desired position to a mesh-like internal power supply wiring pattern which covers the entire internal circuit region and has vdd and Gnd chip terminals at adequate points serving for the internal circuit, and a mesh-like wiring pattern in the surrounding power supply wiring pattern is removed. If a surrounding power supply wiring pattern for an internal circuit is formed for each input/output buffer group by the same method as described above, and the above method is applied to the pattern, a power supply wiring pattern for each internal circuit can be installed.

According to another method, an internal mesh wiring pattern is cut at positions where input/output buffers are placed and, on the other hand, internal Vdd and GND chip terminals are formed at required positions so as not to stop the supply of currents.

Figure 10:
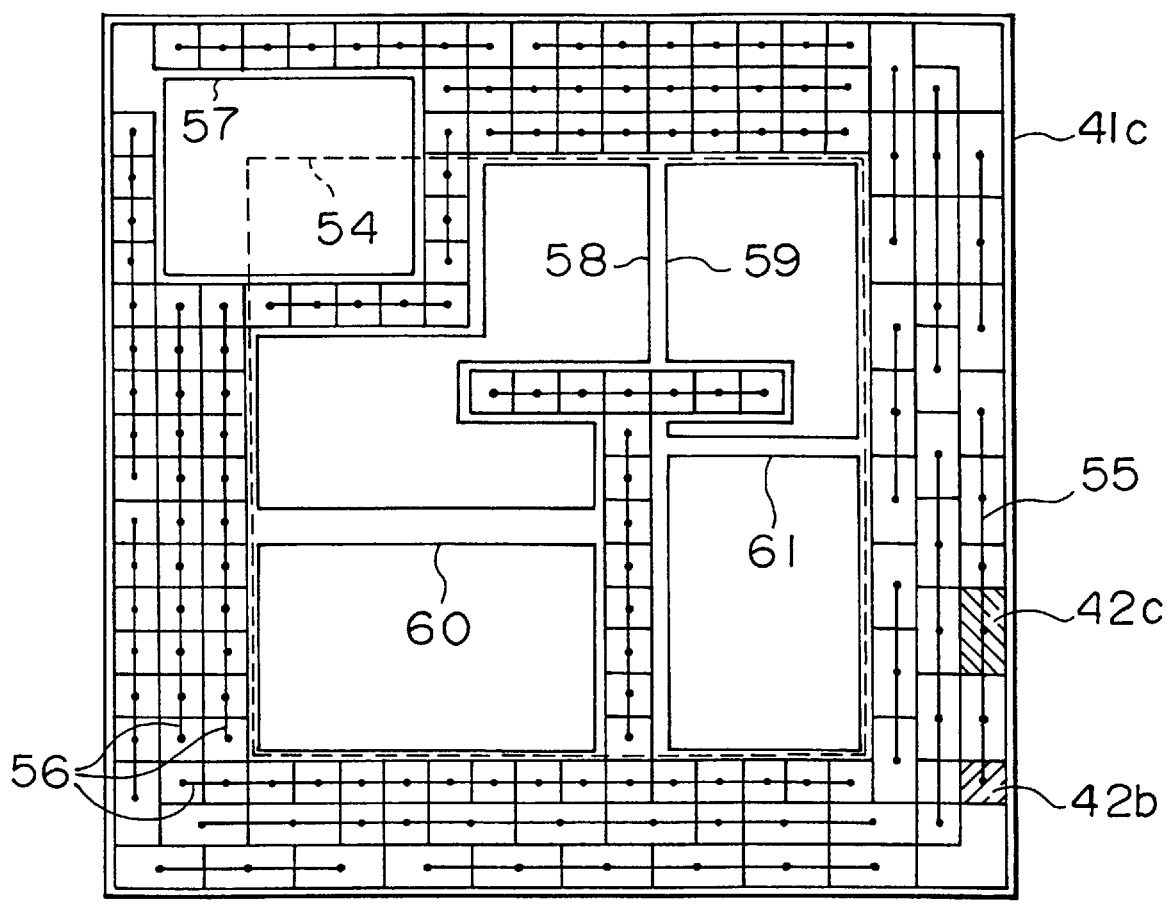
FIG. 10 is a plan view showing a floor plan formation process executed for still another circuit which can be handled in the embodiment of the present invention.

FIG. 10 shows a floor plan obtained by applying the positioning/wiring method of the present invention to the second circuit example different from the circuit example shown in FIG. 4. In this circuit, the number of input/output buffers is very large as compared with the size of an internal circuit. As shown in FIG. 10, input/output buffers 42b and 42c are arranged on even a part of the central region as well as the peripheral portion of the chip. The input/output buffers include two types of buffers, i.e., the input/output buffer 42b and the input/output buffer 42c having a size twice that of the input/output buffer 42b. In this case, the size of the input/output buffer 42c is set to be twice that of the input/output buffer 42b. However, the present invention is not limited to this. It suffices if the buffer 42b has a size corresponding to an integer (including 1) multiple of the integer multiple of the size of each cell arranged in an internal circuit block, and the buffer 42c has a size corresponding to a rational number multiple of the size of the buffer 42b.

Although other identical buffers are not hatched in FIG. 10, all the rectangles having dots in their centers are input/output buffers. A straight line denoted by reference numeral 55 in FIG. 10 is a wiring layer which connects input/output buffers belonging to a group in the form of a row which is obtained as the result of the above-described grouping processing.

Figure 11:
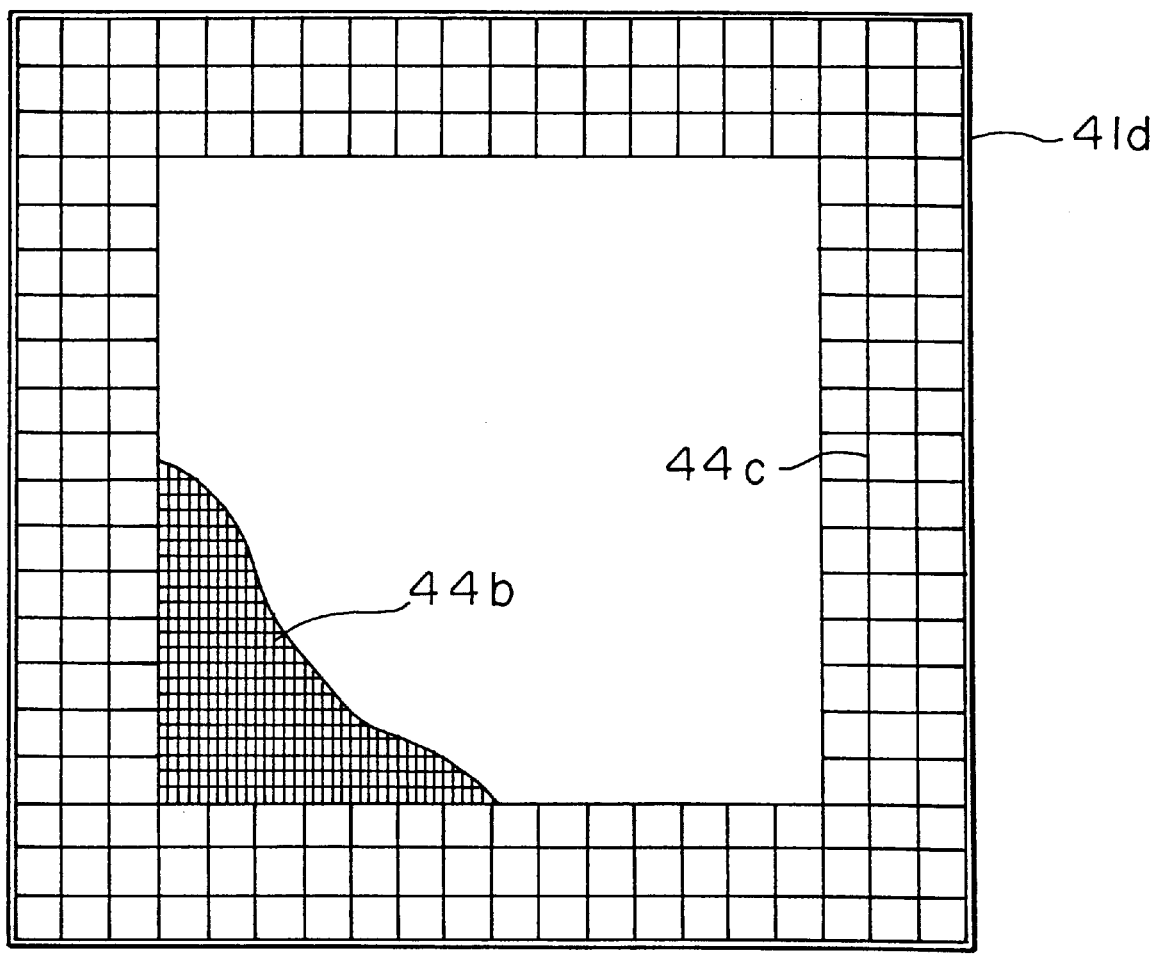
FIG. 11 is a plan view showing a case wherein different block layout position definitions are used for a predetermined internal region and its surrounding region.

In this design example, there is an input/output buffer row whose length exceeds the length of one side of the chip. This buffer row is divided into three small groups indicated by straight lines 56. FIG. 11 shows in detail how different block layout position definitions are used inside and outside a dotted line 54. Referring to FIG. 11, on the central portion of the chip, block layout position definition is performed with the size of a cell which allows small internal circuit blocks to be arranged without leaving any space. In contrast to this, on the portion outside the central portion, definition is performed with an integer multiple of the cell size.

As a result, input/output buffer blocks and internal circuit blocks are arranged at different pitches on the central portion and the peripheral portion. The two types of layout definitions are different from the definition for discriminating input/output buffer blocks from internal circuit blocks in the prior art, but are the same as those in the design example described with reference to FIG. 4 in that these blocks are not discriminated. In this design example, the two types of definitions are used to decrease the number of definition points so as to increase the speed of automatic processing.

It seems that partition definition should be performed with the cell size throughout the chip. However, it is useless to perform partition definition with a small size on the peripheral portion of the chip where only large blocks are arranged. On this portion, therefore, partition definition is performed altogether with a size corresponding to an integer multiple of the cell size.

Referring to FIG. 10, the region in which internal circuits are to be arranged is divided into five regions, namely blocks 57 to 61, from the viewpoint of circuit functions. In each region, floor plan formation processing is performed for internal circuit blocks serving as main components required to guarantee an operation and performance (FIG. 10 does not show this state). Thereafter, temporary wiring length simulation and automatic positioning/wiring processing are performed.

Figure 12:
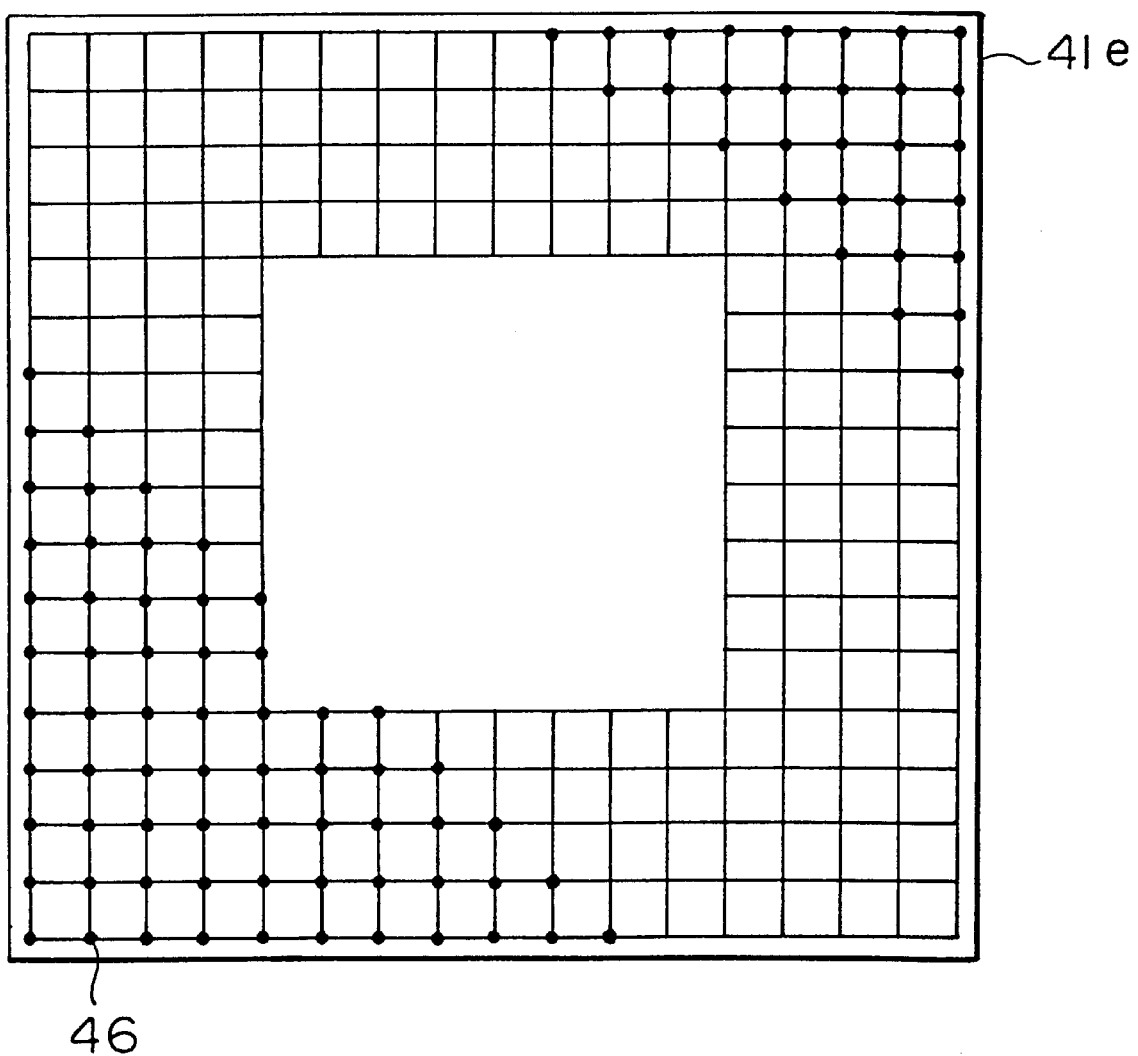
FIG. 12 is a plan view showing the arrangement of ball bumps in the case shown in FIG. 11.

Another difference between this design example and the design example shown in FIG. 4 is that the ball bumps 47 serving as chip terminals are not arranged near the respective input/output buffers but are regularly arranged at the positions indicated by the large dots in FIG. 12. For this reason in the wiring connection process of the second circuit example, the supply of Vdd and GND to the respective input/output buffers, each row of these buffers, and the internal circuits is realized by connecting these ball bumps through dedicated wiring layers.

The step of inserting power supply terminals in each input/output buffer row as in the design example shown in FIG. 4 is not required. The actual wiring length timing simulation process in FIG. 3 is performed after this wiring connection process of the second circuit example (in consideration of the load amounts actually required). If, however, it is apparent that the influence of this connection wiring on the performance is small, the above processes may be performed in the reverse order. The mesh in FIG. 12 indicates the positions where the ball bumps are present. In this case, dots indicating ball bumps are added to only a portion of the chip.

According to this design example, an LSI chip having little useless region can be obtained on the basis of the same design tools as those used for a conventional ASIC by using the design method of the present invention, unlike the conventional ASIC positioning/wiring method in which when the number of input/output buffers is very large as compared with the size of an internal circuit, a chip size is determined by the circumference length determined by the number of input/output buffers, and a wide space is produced in the internal region.

Figure 13:
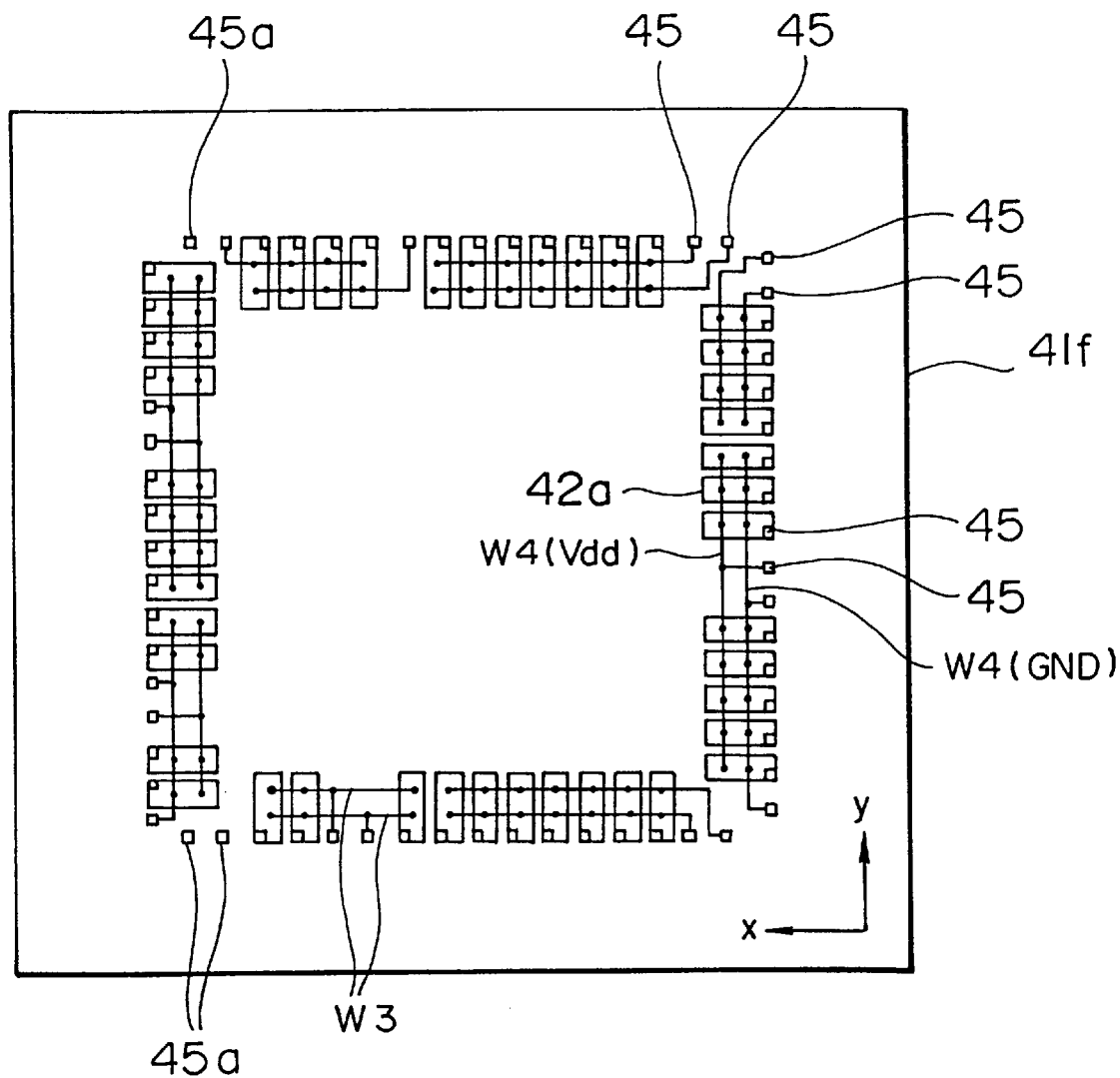
FIG. 13 is a plan view showing a floor plan formation process executed for a still another circuit.

FIG. 13 shows a design example obtained by applying the positioning/wiring method of the present invention to the third circuit. Referring to FIG. 3, this design example is characterized in that the coordinates of the distal ends of the chip-side probes of a probe card are standardized, and when the total number of required test pads is determined, the test pads are arranged in accordance with the predetermined test pad standard coordinates corresponding to the probes equal to or larger than the number of actually required test pads regardless of a chip size.

In this design example, design is performed such that input/output buffers and test pads are arranged to be adjacent to each other, and hence the input/output buffers are arranged in accordance with the arrangement of the test pads. This arrangement is performed in the floor plan formation process in FIG. 3. The method of arranging input/output buffers in the form of a row according to the present invention is also applied to such input/output buffer arrangement processing, and power supply terminals are inserted.

In FIG. 13, a space pad 45a is placed because all test pads on the above standard coordinates need not be used. In general, pads must be formed regardless of whether they are connected. This is because when the probes of the probe card are pressed against the chip surface, and there are portions made of a material different from the metal for the pads, the degree of wear of the probes pressed against the portions become different from those of the remaining probes, and the contact conditions of the probe change in measuring the next product.

Block layout position definition in this design example is performed such that partition definition (not shown) is performed with uniform cells throughout the entire chip surface as in the case shown in FIG. 4. Internal circuit blocks are arranged inside and outside a square pattern of input/output buffers.

Signal lines inside and outside the square pattern are connected by forming wiring layers in the spaces between the input/output buffers. In this design example as well, four wiring layers are used. The third wiring layer W3 is always used for the Vdd and GND wiring layers in the x direction of input/output buffers now shown in FIG. 13, and the fourth wiring layers W4 (Vdd) and W4 (GND) are used for wiring layers in the y direction. Test pads 45 are made of the fourth wiring layer.

The wiring layers passing between the input/output buffers are the first and third wiring layers in the x direction, and the second and fourth wiring layers in the y direction. These wiring layer installation directions are common to all the internal circuit portions. That is, in the automatic wiring processing, the main wiring layer installation direction of the first and third wiring layers is the x direction, and the sub wiring layer installation direction is the y direction. The main wiring layer installation direction of the second and fourth wiring layers is the y direction, and the sub wiring layer installation direction is the x direction. Note that reference numeral 45a in FIG. 13 denotes a space pad.

Figure 14:
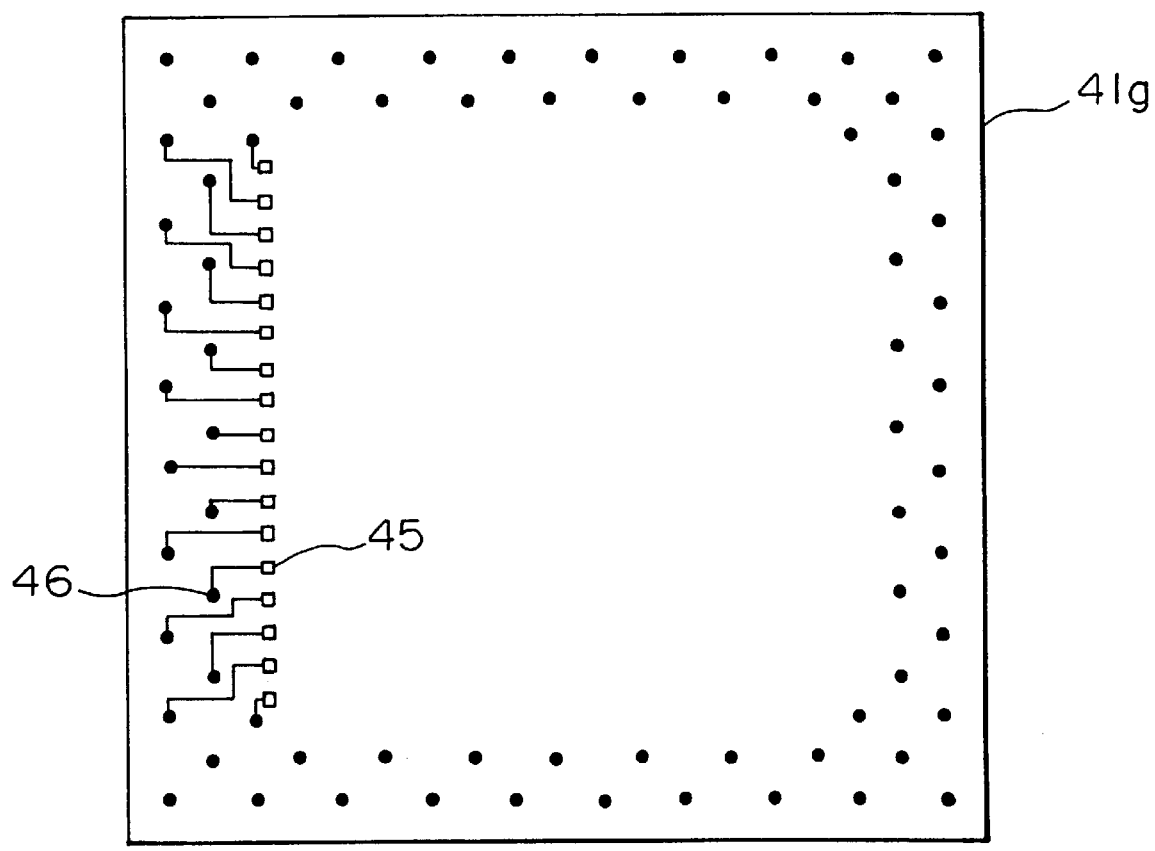
FIG. 14 is a plan view showing wiring/connection of test pads and chip terminals.

FIG. 14 shows a state wherein the test pads and ball bumps (chip terminals) 46 are wired/connected to each other for the chip shown in FIG. Referring to FIG. 14, in this design example as well, the chip terminals 46 are not formed immediately above the test pads 45, but are regularly arranged on the peripheral portion of the chip. The test pads 45 and the chip terminals 46 are connected to each other in accordance with the rule of using the third wiring layer in the x direction, and the fourth wiring layer in the y direction. A metal layer as the fourth wiring layer is placed immediately below each chip terminal, and each solder ball is formed through the barrier metal. FIG. 14 shows only connection of 17 test pads on the left side of the chip in FIG. 13, but does not show other portions.

What is claimed is:

1. An automatic positioning/wiring method for a flip-chip semiconductor device which is adapted to design a semiconductor chip including chip terminals for connecting an external unit formed in another semiconductor chip, input/output buffers for exchanging signals with the external unit, and internal circuit blocks which perform predetermined circuit operations in response to signals from the input/output buffers, comprising the steps of:

positioning/wiring the internal circuit blocks and the input/output buffers in arbitrary regions on the semiconductor chip in an automatic positioning/wiring design process on the basis of a result of a layout position determination process for performing definition such that the input/output buffers and the internal circuit blocks are arranged without discrimination layout regions thereof;

performing a floor plan formation process to arrange the input/output buffers into predetermined groups within the arbitrary region in the form of rows each parallel to one of sides of the semiconductor chip; and approximately arranging the input/output buffers in each of the groups in the form of a row at an arbitrary position along a direction of a main axis parallel to one side of the semiconductor chip or a direction of a sub-axis parallel to the other side of the semiconductor chip.

2. A method according to claim 1, wherein the layout position determination process and the floor plan formation process comprise:

a buffer division step of dividing the input/output buffers into a plurality of groups in advance in accordance with a plurality of power supply lines which are electrically independent of each other;

a layout position definition step of defining block layout positions to commonly arrange the input/output buffers and the internal circuit blocks on a surface of the chip without discriminating the input/output buffers and the internal circuit blocks;

a rearrangement step of, when a length of one of the rows of the input/output buffers exceeds a length of one side of the semiconductor chip, performing layout position adjustment by further dividing the row of the input/output buffers into small groups such that all the input/output buffers are distributed and belong to the small groups in the form of rows;

a power supply wiring step of wiring/connecting the power supply feed lines, which are respectively constituted by pairs of power supply lines and electrically independent of each other, to the input/out buffers belonging to the plurality of small groups in the form of rows having undergone the layout position adjustment; and an overall positioning/wiring step of performing automatic positioning/wiring of the overall chip by using layout data of the input/output buffers belonging to the plurality of small groups in the form of rows having undergone the layout position adjustment.

3. A method according to claim 2, wherein the rearrangement step comprises the step of performing insertion/positioning of at least a pair of power supply test pads or the pair of test pads and chip terminals which are connected to the pair of power supply lines in each of the plurality of groups in the form of rows by performing layout position adjustment of the input/output buffers, and when a length of one of the rows of the input/output buffers exceeds a length of one side of the semiconductor chip upon the insertion/positioning, performing layout position adjustment by further dividing the row of the input/output buffers into small groups such that all the input/output buffers are distributed and belong to the small groups.

4. A method according to claim 2, further comprising:

the macro data creation step of creating macro data required to handle each of the input/output buffer groups arranged in the form of rows upon layout position adjustment in the rearrangement step as one macro data in the automatic positioning/wiring process, each of the groups including the pair of power supply lines and at least a pair of power supply chip terminals connected to the power supply lines; and the automatic positioning/wiring step of performing an automatic positioning/wiring process of the overall semiconductor chip by setting layout position data of the input/output buffer groups having undergone the layout position adjustment as initial arrangement data of the macro data, and using the macro data.

5. A method according to claim 3, further comprising:

the macro data creation step of creating macro data required to handle each of the input/output buffer groups arranged in the form of rows upon layout position adjustment in the rearrangement step as one macro data in the automatic positioning/wiring process, each of the groups including the pair of power supply lines and at least a pair of power supply chip terminals connected to the power supply lines; and the automatic positioning/wiring step of performing an automatic positioning/wiring process of the overall semiconductor chip by setting layout position data of the input/output buffer groups having undergone the layout position adjustment as initial arrangement data of the macro data, and using the macro data.

6. A method according to claim 1, wherein when the plurality of input/output buffer groups in the form of rows are arranged on at least one side of the semiconductor chip, and the power supply chip terminals or signal chip terminals included in the groups are arranged in a corner region, at least one parallelizing bump is formed in each of remaining corner regions to maintain a parallel state between the semiconductor chip and a predetermined mounting board in mounting the semiconductor chip on the mounting board with the chip facing down.

7. A method according to claim 1, wherein the plurality of input/output buffer groups in the form of rows, and the internal circuit blocks are arbitrarily positioned/wired together in a region including a peripheral portion on the same semiconductor chip.

8. A method according to claim 1, wherein the internal circuit blocks are arranged in a region including a peripheral portion on the same chip, the plurality of input/output buffer groups in the form of rows are positioned/wired at arbitrary positions in a region inside the peripheral region, and the parallelizing bumps are arranged in the chip corner regions.

9. A method according to claim 1, wherein first block layout position definition with a small pitch is performed for a predetermined internal region in the same semiconductor chip, block layout position definition with a pitch corresponding to an integer multiple of the block pitch of the first block layout position definition is performed for a peripheral region surrounding the predetermined internal region, the plurality of input/output buffer groups in the form of rows in which the input/output buffers each having a first block size corresponding to an integer (including 1) multiple of an integer multiple of the block pitch and second input/output buffers each having a size corresponding to a rational number multiple of the first block size are arranged together are positioned/wired in the peripheral region surrounding the predetermined internal region, the internal circuit blocks are arranged at arbitrary positions in the predetermined internal region, and the plurality of input/output buffer groups in the form of rows constituted by the input/output buffers having the first block size are also positioned/wired among the internal circuit blocks.

10. A method according to claim 1, wherein coordinates of probe tips of a probe card are standardized, the chip test pads of the semiconductor chip are arranged at positions corresponding to the standardized coordinates regardless of a chip size, and the plurality of input/output buffer groups in the form of rows are positioned/wired in correspondence with the pad positions.

11. A method according to claim 1, wherein the chip terminals corresponding to the test pads are arranged in a staggered pattern in a peripheral region of the region in which the test pads are arranged, and are wired to the test pads.

* * * * *